(12) United States Patent
Lin et al.

(10) Patent No.: US 8,692,224 B2
(45) Date of Patent: Apr. 8, 2014

(54) HIGH CONSISTENCY RESISTIVE MEMORY AND MANUFACTURING METHOD THEREOF

(75) Inventors: Yinyin Lin, Shanghai (CN); Lingming Yang, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 13/809,966

(22) PCT Filed: Jul. 14, 2011

(86) PCT No.: PCT/CN2011/001162
§ 371 (c)(1),
(2), (4) Date: Mar. 5, 2013

(87) PCT Pub. No.: WO2012/006869
PCT Pub. Date: Jan. 19, 2012

(65) Prior Publication Data
US 2013/0193397 A1     Aug. 1, 2013

(30) Foreign Application Priority Data
Jul. 16, 2010   (CN) .......................... 2010 1 0228039

(51) Int. Cl.
*H01L 47/00*   (2006.01)
(52) U.S. Cl.
USPC ............................................. 257/4; 438/382
(58) Field of Classification Search
USPC ............................................. 257/4; 438/382
See application file for complete search history.

(56) References Cited

U.S. PATENT DOCUMENTS

2008/0173931 A1     7/2008   Ho et al.

FOREIGN PATENT DOCUMENTS

| CN | 1976082 | 6/2007 |
|---|---|---|
| CN | 101118922 | 6/2008 |
| CN | 101388435 | 3/2009 |

*Primary Examiner* — Marvin Payen
(74) *Attorney, Agent, or Firm* — McDonnell Boehnen Hulbert & Berghoff LLP

(57) ABSTRACT

The present invention relates to the technical field of memories, and in particular to a highly-consistent resistive memory and method of fabricating the same. The resistive memory comprises: a lower electrode which is formed in a first dielectric layer by patterning; a second dielectric layer formed on the lower electrode and the first dielectric layer and provided with an opening for exposing the lower electrode to perform patterning; an edge wall formed in the opening of the second dielectric layer for covering a border area of the lower electrode and the first dielectric layer so that only the middle area of the lower electrode is partially or totally exposed; a storage medium layer formed by performing oxidization with the second dielectric layer and the edge wall as mask; and an upper electrode. The resistive memory exhibits good consistency and high reliability; moreover, unit size is mall, which is advantageous for improving storage characteristic. When an array of memories is formed by the resistive memories, a good consistency is obtained among multiple resistive memories.

12 Claims, 7 Drawing Sheets top view

A-A sectional view top view

C-C sectional view top view

A-A sectional view top view

A-A sectional view top view

A-A sectional view top view

A-A sectional view top view

A-A sectional view

HIGH CONSISTENCY RESISTIVE MEMORY AND MANUFACTURING METHOD THEREOF

FIELD OF THE INVENTION

The present invention relates to the technical field of memories, and in particular to a highly-consistent resistive memory and method of fabricating the same.

BACKGROUND

As one of the future alternative technologies of flash memory, resistive memories have drawn widespread attention due to their such characteristics as being high in density, low in cost, and being able to break through the restricts in development of process technology generations, etc. The resistive memory enables storage medium to be reversibly converted between a high resistance state (HRS) and a low resistance state (LRS) under the effect of electrical signals, thus realizing storage function. As one of the storage medium materials, metal oxide semi-conductor material is used by the resistive memory, such as copper oxide (CuxO, $1<x\leq2$,) tungsten oxide ($WO_x$, $1<x\leq3$), titanium oxide, etc.

There are substantially two methods of fabricating the metal oxide: the first one is to form a layer of metal oxide as storage dielectric layer on the lower electrode by film deposition; the second one is to use this metal as lower electrode and then perform self-aligned oxidizing the lower electrode to form a layer of metal oxide as storage dielectric layer; wherein the second method is being widely used due to such characteristics as self-alignment and simplicity in technical process, etc.

In the second method, the storage characteristic of storage dielectric layer formed by oxidization is largely affected by evenness of the metal layer. The better the evenness of the metal layer is, the more consistent the characteristic of the metal oxide layer thus formed will be, and the better the consistency of the resistive memory will be.

However, during the formation of the lower electrode, the metal layer is generally formed in the dielectric layer by patterning, and when the metal layer is being formed in the dielectric layer, it is generally required to firstly form a diffusion barrier layer before forming the metal layer. Typically, the characteristic of metal layer in the middle area of metal layer differs much from that of metal layer adjacent to the border area with the dielectric layer. For example, the sizes of grains are different and the crystal orientations are different. When the metal oxide layer is formed by self-alignment oxidization of the metal layer, the characteristics of storage medium layers formed by oxidization will also differ greatly since the characteristics of metal layers in the same pattern differ much from each other. In particular, as the size is scaled down, it is difficult for each memory unit to ensure that the storage medium layer is formed by self-aligning with the middle area of the metal layer; therefore, it becomes more difficult for many memory units to ensure that the storage medium layer is each formed by self-aligning with the middle area of the metal layer. Thus, when this method is used to form resistive memory, a challenge is put to the consistency of memory.

The above problem will be discussed hereinafter with reference to a $Cu_xO$ resistive memory.

FIG. 1 shows a schematic structural view of a $Cu_xO$ resistive memory in the prior art, wherein a top view and a C-C sectional view of the resistive memory are shown. In the prior art, a $Cu_xO$ resistive memory is generally integrated into a back-end structure of copper interconnection. That is, a copper lead or copper plug in the copper interconnect structure is used as a lower electrode and the storage medium layer is further formed by oxidization. As shown in FIG. 1, an interlayer dielectric layer for forming a certain layer of copper lead is indicated by "10", an etch-terminating layer is indicated by "11", a cap layer is indicated by "13", a diffusion barrier layer of the copper lead is indicated by "21", a seed crystal layer in the copper lead is indicated by "22", and a copper lead in the middle area is indicated by "23". The copper lead in the middle area 23 (i.e. the middle area copper lead) and the seed crystal layer 22 situating in the edge area of the copper lead (i.e., the border area with the dielectric layer) generally exhibit distinctly different characteristics; the sizes and crystal orientations of grains are different. When oxidization is performed on the copper lead, the rate of oxidization will differ between the middle area and the edge area, and the storage characteristic of the $Cu_xO$ storage medium layer 30 formed by oxidization would also be uneven. When the oxidization is performed, generally, a hole is provided in the cap layer 12 so as to expose the copper lead and perform oxidization. However, since the feature size is becoming smaller and smaller, the width of the copper lead itself (in the left-right direction shown in the drawing) is also becoming smaller and smaller. If only the middle area 23 is exposed to perform patterning and oxidization, it is necessary to set the size of hole in the cap layer 12 to be very small, which would greatly increase cost of process; moreover, during oxidization, the oxidized film will also partially grow diffusely towards two sides; therefore, if the metal layer is not exposed at a smaller size and with concentration in the middle area, the performances of the $Cu_xO$ storage medium layer 30 formed by the seed crystal layer 22 (the areas circled by dashed-lines in FIG. 1) and the $Cu_xO$ storage medium layer 30 formed in the middle area 23 are different for the same memory unit; for multiple memory units, the $Cu_xO$ storage medium layer of some memory units may be formed in the middle area 23, and the $Cu_xO$ storage medium layer of some memory units may be also formed by the seed crystal layer 22; thus, there arises problem with this type of resistive memory in terms of consistency.

Similarly, the above problem also exists with other electrode materials (e.g., tungsten) formed in the dielectric layer by patterning.

SUMMARY OF THE INVENTION

In view of above problem, the object of the present invention is to improve consistency of resistive memory.

In order to realize the above object or other objects, the invention provides the following technical solutions:

According to one aspect of the invention, a resistive memory is provided, comprising:

a lower electrode which is formed in a first dielectric layer by patterning;

a second dielectric layer formed on the lower electrode and the first dielectric layer and provided with an opening for exposing the lower electrode to perform patterning;

an edge wall formed in the opening of the second dielectric layer for covering a border area of the lower electrode and the first dielectric layer so that only the middle area of the lower electrode is partially or totally exposed;

a storage dielectric layer formed by performing oxidization with the second dielectric layer and the edge wall as mask; and an upper electrode.

In an embodiment of the resistive memory provided by the invention, the resistive memory is integrated in a copper interconnect structure, and the storage medium layer is a $Cu_xO$ storage medium layer, wherein $1<x\leq2$.

In the above resistive storage, the lower electrode can be copper lead, or the lower electrode can be copper plug.

In the above resistive storage, the border area of the lower electrode and the first dielectric layer comprises a diffusion barrier layer and a copper seed crystal layer.

In the above resistive storage, the middle area of the lower electrode is a copper lead area formed by electroplating.

In the above resistive storage, the first dielectric layer can be interconnected wires dielectric layer; the second dielectric layer can be cap layer. The first dielectric layer can also be inter-layer dielectric layer, and the second dielectric layer can also be etch-terminating layer.

In the above resistive storage, preferably, the copper interconnect structure is a copper interconnect structure with a process node below 65 nm.

According to another aspect of the invention, a method for fabricating the above resistive memory is provided, comprising the following steps:

providing a lower electrode which is formed in a first dielectric layer by patterning;

forming a second dielectric layer which covers the lower electrode and the first dielectric layer;

forming an opening in the second dielectric layer which exposes the lower electrode;

forming an edge wall in the opening for covering a border area of the lower electrode and the first dielectric layer so that only the middle area of the lower electrode is partially or totally exposed;

forming a storage medium layer by performing oxidization with the second dielectric layer and the edge wall as mask; and depositing an upper electrode.

Specifically, the edge wall is formed by firstly depositing a layer of dielectric film which covers the opening and then performing etch. The oxidization can be plasma oxidization, heating oxidization or wet oxidization.

According to yet another aspect of the invention, a memory is provided which comprises an array of memories. The array of memories comprises a plurality of above-described resistive memories arranged in rows and columns.

The technical effects brought about by the invention can be summarized as follow. With the provision of edge wall, the border area of the lower electrode and the first dielectric layer is covered and only the middle area of the lower electrode is exposed. Therefore, a storage dielectric layer is formed by performing self-aligning oxidization in the middle area of the lower electrode, which is favorable for improving the consistency of resistive memory. Meanwhile, the reliability problem caused when the storage medium layer is formed by oxidizing the border area of the lower electrode can also be avoided, thus presenting high reliability. For an array of resistive memories, this arrangement is also beneficial for improving consistency between a plurality of resistive memories. Moreover, the size of resistive memory is reduced, which is advantageous for improving storage performance thereof.

BRIEF DESCRIPTION OF THE DRAWINGS

The above and other objects and advantages of the invention will become fully understood from the following detailed description with reference to drawings, in which identical or similar elements are denoted by identical reference signs.

DETAILED DESCRIPTION OF THE INVENTION

Figure 1:
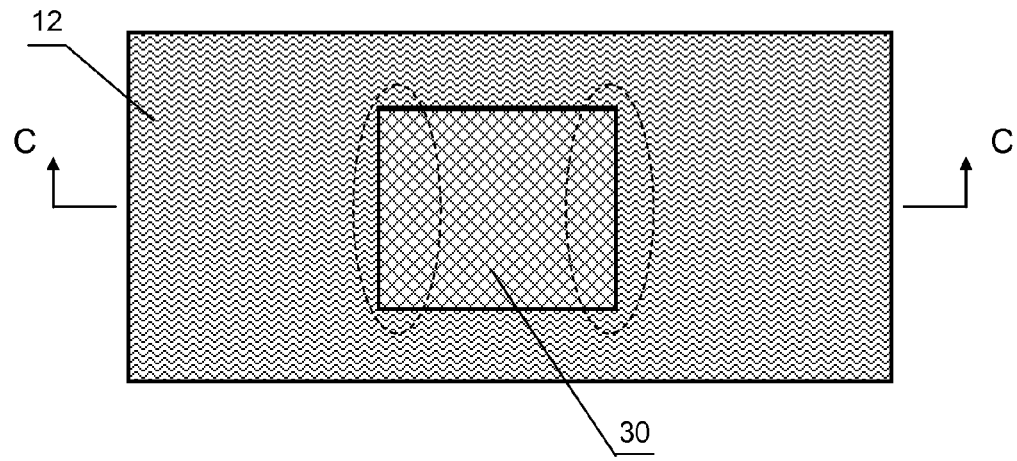
FIG. 1 is a schematic structural view of a $Cu_xO$ resistive memory in the prior art.
Figure 1:
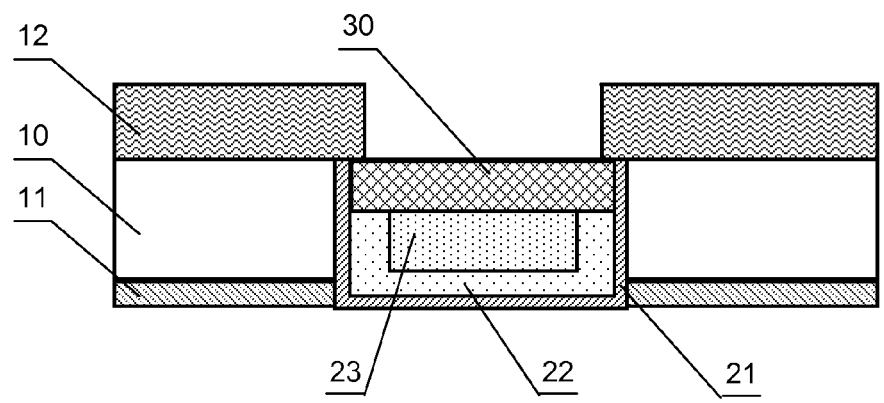

The invention will be described in more details hereinafter in the exemplary embodiments with reference to the drawings. Some preferred embodiments are provided herein, but it should not be construed that the invention is merely limited to the embodiments illustrated herein. In the drawings, the thicknesses of layers and areas have been exaggerated for reasons of clarity, but these schematic views should not be construed as strictly reflecting the proportional relationship among geometric sizes.

The reference views provided herein are schematic views of ideal embodiments of the invention, and the embodiments illustrated in the invention should not be construed as being limited to the particular shape of the area shown in the drawings; rather, the resultant shapes such as the deviation caused by manufacturing are also included. For example, curves that are obtained by dry etching typically have such characteristics as being curved or rounded. However, in the drawings of the embodiments of the invention, all the shapes are represented by rectangles. The representation in the drawings is exemplary and should not be construed as limiting the scope of the invention.

Figure 6:
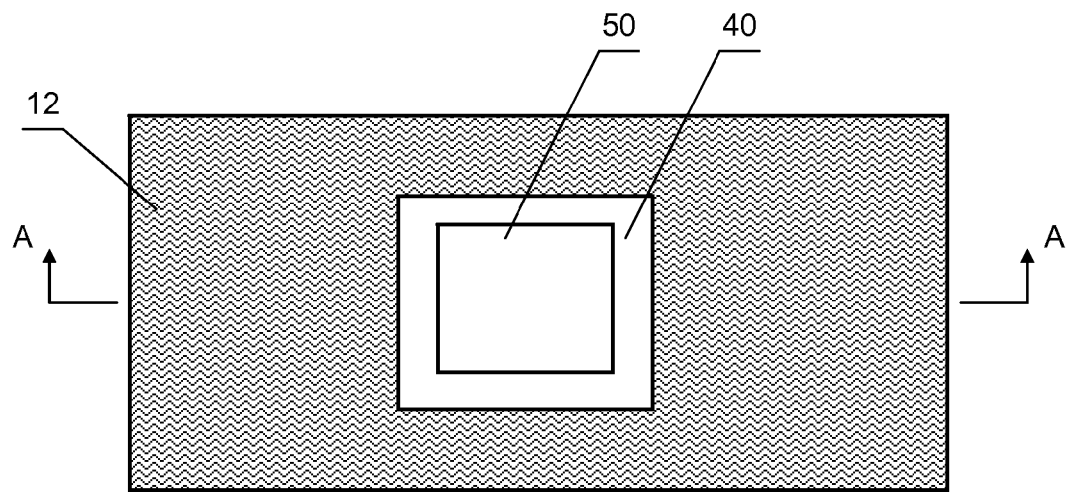
Figure 6:
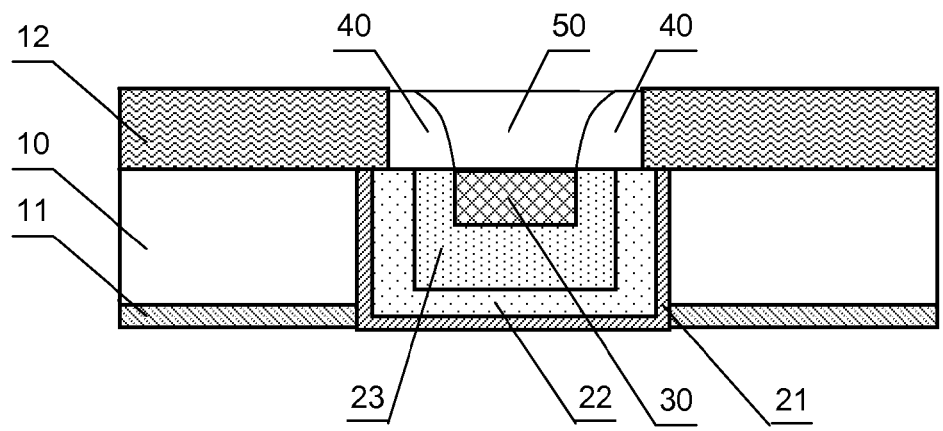

FIG. 6 is a schematic structural view of a resistive memory in accordance with an embodiment of the invention. In FIG. 6, a top view and an A-A sectional view of the resistive memory in accordance with the embodiment are shown. As shown in FIG. 6, in this embodiment, description is made with reference to an example in which the resistive memory is integrated in a copper interconnect structure. More specifically, the resistive memory is formed on a copper lead of the copper interconnect structure (i.e., the copper lead serves as the lower electrode of the resistive memory, and self-aligning oxidization is performed on the copper lead to form $Cu_xO$ storage medium layer). The layer at which the copper lead is specifically located in not limited by the invention. For example, the copper lead can be located at the first layer or the third layer, etc. Generally, the copper lead is formed by patterning in a certain shape. In this embodiment, the copper lead is formed in interconnected wires dielectric layer 10 by the Damascus process. Located under the interconnected wires dielectric layer 10 is an etch-terminating layer 11 for terminating etching when forming trench by pattern-etching the inter-layer dielectric layer 10. The interconnected wires dielectric layer 10 can be dielectric materials such as $SiO_2$, $Si_3N_4$, or low-k materials such as FSG, USG, or other materials that can bring about the same effects.

Generally, when metal wires are formed in the interconnected wires dielectric layer 10, it is required to prevent metal atoms from diffusing into the interconnected wires dielectric layer 10 to affect the performance of the interconnected wires dielectric layer 10. Specifically, for copper metal, it is particularly required to prevent copper diffusion. Therefore, when the copper lead is formed by Damascus process, a diffusion barrier layer 21 is firstly formed in the trench, then a copper seed crystal layer 22 is formed on the diffusion barrier layer 21 before electroplating the copper lead, and then a middle area copper layer 23 is electroplated so as to form the copper lead. Therefore, the copper lead actually comprises the diffusion barrier layer 21, the copper seed crystal layer 22 and the middle area copper layer 23 which are distributed in the order from the edge towards the middle portion of the trench. The diffusion barrier layer 21 can be TaN, Ta/TaN complex layer or Ti/TiN complex layer, or other conductive materials that can function as well, such as TiSiN, $WN_x$, $WN_xC_y$, Ru, TiZr/TiZrN, etc. The specific material of the diffusion barrier layer 21 is not limited by the invention, and can be evolved with the development of the process generation technology. The copper seed crystal layer 22 is typically formed by film depositing such as sputtering, and has a thickness which is generally smaller than that of the middle area copper layer 23 (the dimensional proportion shown in the drawings is merely schematic) that is formed by electroplating growth. Therefore, although the copper seed crystal layer 22 in the edge area of the trench and the middle area copper layer 23 are both made of copper material, they exhibit some distinctly different physical characteristics due to different preparation process thereof. For example, the middle area copper layer 23 has a relatively larger grain size and different crystal orientations of grains, etc, which will all have an influence on the velocity of subsequent self-aligning oxidization process and film performances of the resultant $Cu_xO$ storage medium layer, etc. Therefore, in this embodiment, the portion between the middle area copper layer 23 and the interconnected wires dielectric layer 10 is defined as a border area of the copper lead and the interconnected wires dielectric layer 10, which surrounds the middle area copper layer 23. The border area may comprise different conductive materials such as the diffusion barrier layer 21 and comprise copper metal material that exhibits different physical characteristics from the middle area copper layer 23. For other metals formed in the trench (or apertures) of the dielectric layer, the diffusion barrier layer exists for most of them. Even if the diffusion barrier layer does not exist, the physical characteristics of the metal layer are distinctly different at the interface between the dielectric layer and the metal layer due to differences in interface characteristics. Therefore, for all the metal lower electrodes formed in the dielectric layer, they can be divided into a border area and a middle area. The electrodes in the middle area have a more consistent physical structure and characteristics, and the border area is an area where the physical structure is more variable and characteristics are less consistent.

Still with reference to FIG. 6, the resistive memory further comprises a cap layer 12. In the copper interconnect structure, the cap layer 12 serves to prevent electromigration on the upper surface of the copper lead. The cap layer 205 is also an insulating dielectric layer. Specifically, the cap layer can be $Si_3N_4$, SiON, SiCN, SiC, $SiO_2$ or a complex layer containing any of $Si_3N_4$, SiON, SiCN, SiC, $SiO_2$. An opening shown in the figure is formed in the cap layer 12 so as to pattern-expose the copper lead. With the continuous reduction in process feature size, the size of copper interconnect structure is also scale down proportionally, and the width of the copper lead (the size in the left-right direction of the drawing) is also reduced continuously. If an opening provided in the cap layer 12 merely exposes a part of the middle area copper 30, the size of the opening is required to be smaller and the requirements on patterning will be higher. For example, the precision of lithography is required to be greatly improved, which may accordingly considerably increase the cost of lithography patterning. For example, if the size of the width of copper lead is 90 nm and the size of the width of middle area copper 30 is 45 nm, then under the current lithography technical generation for forming the copper interconnect structure, it is easy to form an opening having a size of 90 nm, while if an opening having a size of 45 nm is to be formed, a more advanced lithography technical generation is required to be employed. However, the improvement in lithography technology requires tremendous equipment cost and puts high demands on technology (accordingly, the resistive memory of the invention is more adapted to a structure of small size process generation, e.g., a copper interconnect structure with a process node below 65 nm). Therefore, as in the prior art, an opening is also provided in the cap layer 12 to expose the copper lead in the invention, but the invention is elaborately designed to further comprise an edge wall 40 formed at the edge of the opening of the cap layer 12. The width size of the edge wall 40 is designed according to the specific size of the border area and the size of the opening so that the edge wall 40 can substantially cover the copper lead in the border area (e.g., cover the copper seed crystal layer 22), thereby decreasing the size of the opening so as to merely partially or totally expose the middle area copper 30; the middle area copper 30 has a relatively uniform physical structure and consistent performance, and accordingly, the $Cu_xO$ storage dielectric layer 30 formed thereon by self-aligning is also consistent in performance. In addition, since the size of opening is reduced, the size of storage medium of the resistive memory is also reduced, which is advantageous for reducing the size of the resistive memory and improving storage performance.

Still with reference to FIG. 6, the storage dielectric layer 30 is typically formed by plasma oxidization, but the specific oxidization method and the thickness are not limited by the embodiments of the invention. During oxidization, the exposed copper lead may be oxidized transversely so that a part of storage medium layer is also formed under the edge wall 40. If the copper lead forming this part of storage medium layer is the copper seed crystal layer 23, it is also possible that the storage characteristic of the storage medium layer 30 becomes inconsistent. In order to avoid such a circumstance, the width size of the edge wall 40 can be increased appropriately so that only a part of the middle area copper 30 is exposed. Thus, it can be ensured that all the storage medium layer 30 is formed by oxidizing the middle area copper 30.

Still with reference to FIG. 6, the resistive memory further comprises an upper electrode 50 formed on the storage medium layer 30. The upper electrode 50 can be made of TaN, Ta, TiN, Ti, Cu, Al, Ni or Co, etc., and the specific material thereof is not limited by the embodiments of the invention. In this embodiment, the upper electrode 50 is formed in the aperture surrounded by the edge wall 40.

FIG. 6 merely illustrates the part of the copper interconnect structure that forms the resistive memory, the other parts of the copper interconnect structure are well known to those skilled in the art and are thus not shown the drawings and discussed repeatedly.

FIGS. 2-6 are preparation process views showing the formation of the resistive memory of the embodiment shown in FIG. 6. The preparation process of the resistive memory will be described in detail with reference to FIGS. 2-6.

Figure 2:
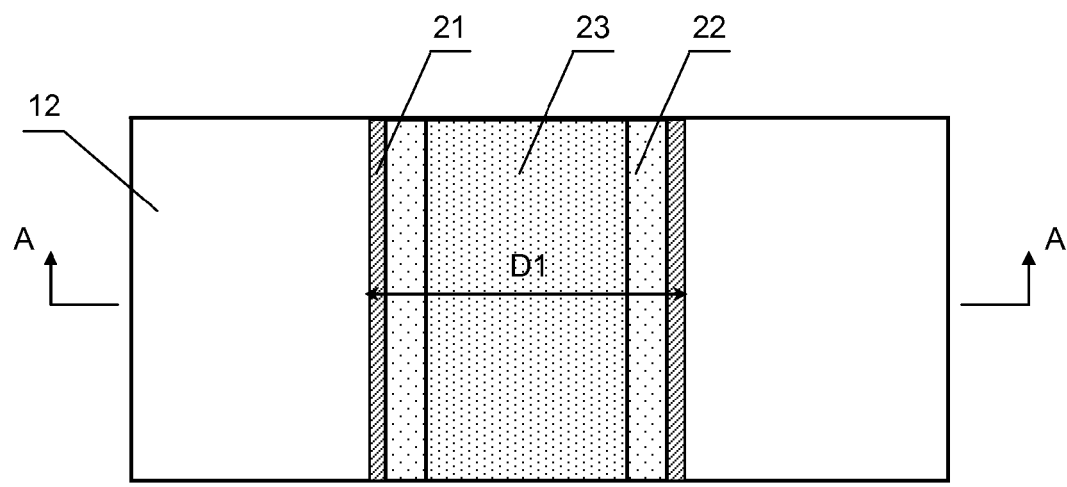
FIGS. 2-6 are preparation process views showing the formation of the resistive memory of the embodiment shown in FIG. 6.
Figure 2:
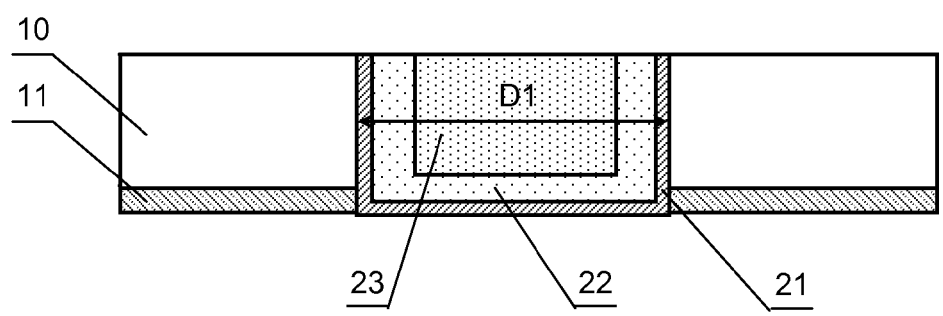

Firstly, as shown in FIG. 2, a structure is provided in the copper interconnect structure after the formation of the copper lead and prior to the formation of the cap layer. The copper lead is formed in the trench of the interconnected wires dielectric layer 10 by being inlayed. Specifically, the diffusion barrier layer 21 is firstly formed by performing CVD (Chemical Vapor Deposition) or PVD (Physical Vapor Deposition) in the trench. Then, the copper seed crystal layer 22 is formed by performing PVD depositing. Later on, the middle area copper layer 23 of the copper lead is formed by electroplating growth. The width size of the trench is defined as D1, accordingly, the width of the copper lead is also D1. For the metal lower electrodes formed in the dielectric layer, they can be divided into a border area and a middle area, wherein the border area is the diffusion barrier layer 21 and the copper seed crystal layer 22, and the middle area is the middle area copper layer 23. The lower electrodes in the middle area have a more uniform physical structure and characteristics, and the border area is an area where the physical structure is more variable and less uniform. Therefore, in the invention, efforts have been made to form the storage medium of the resistive memory in self-alignment with the middle area copper layer 23 so that the characteristic of the storage medium layer is more consistent and the characteristic of the memory is thus more consistent.

Figure 3:
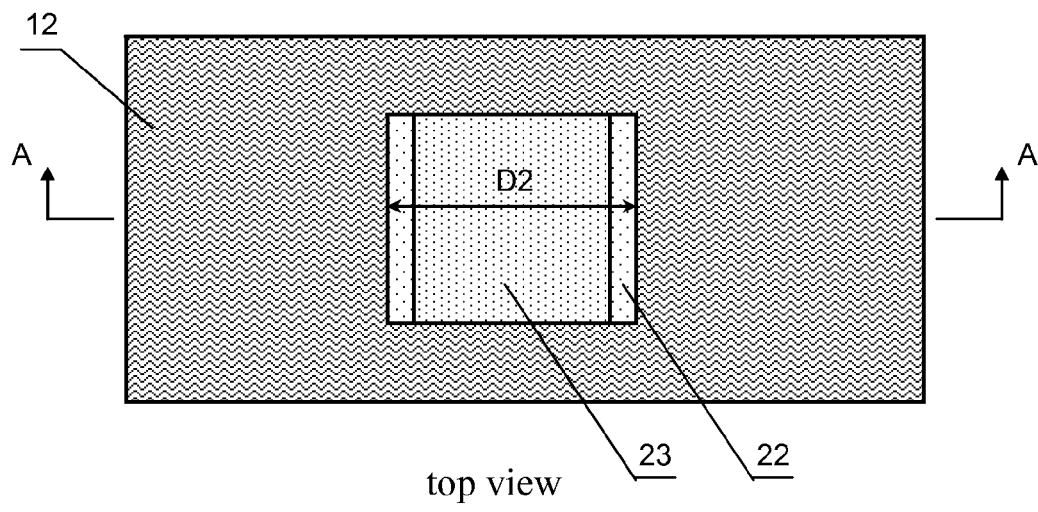
Figure 3:
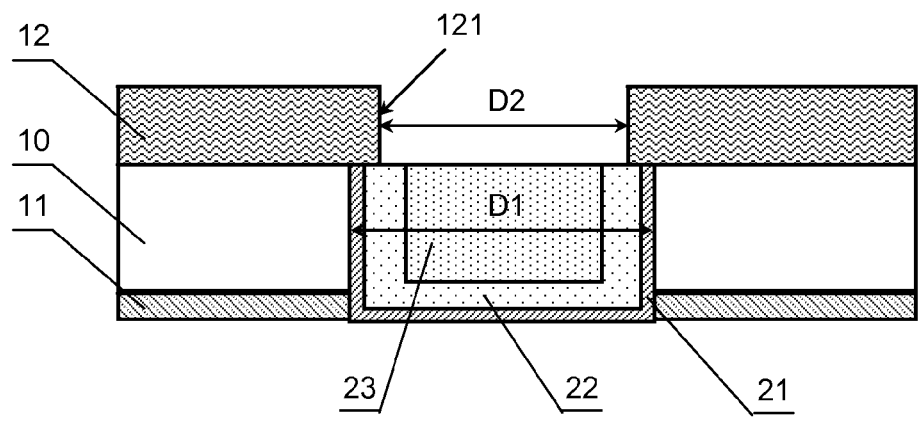

Furthermore, as shown in FIG. 3, the cap layer 12 is formed by performing CVD growth on the dielectric layer 10 and the copper lead, and an opening 121 is pattern-formed in the cap layer 12 so as to expose the copper lead. The opening 121 is formed in the cap layer 12 by steps of lithography and etching, and the size D2 of the opening 121 may be substantially identical to the width size D1 of the copper lead. In this embodiment, the size D2 of the opening 121 is slightly smaller than the width size D1 of the copper lead, yet allowing most of the border area to be exposed by the opening. The size D2 can be specifically selected in accordance with the width size D1 of the copper lead and process conditions of lithography. If it is difficult to form an opening pattern smaller than D1 by lithography, forming an opening pattern of the size of D1 would be acceptable.

Figure 4:
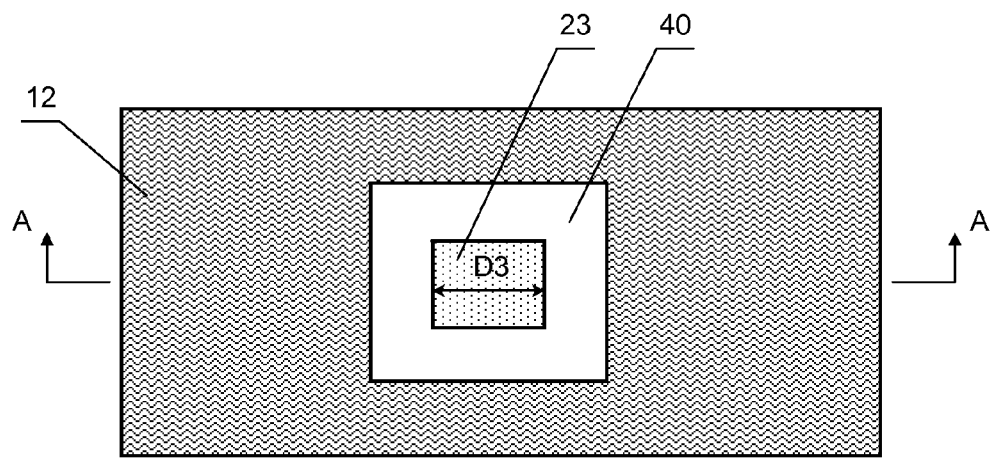
Figure 4:
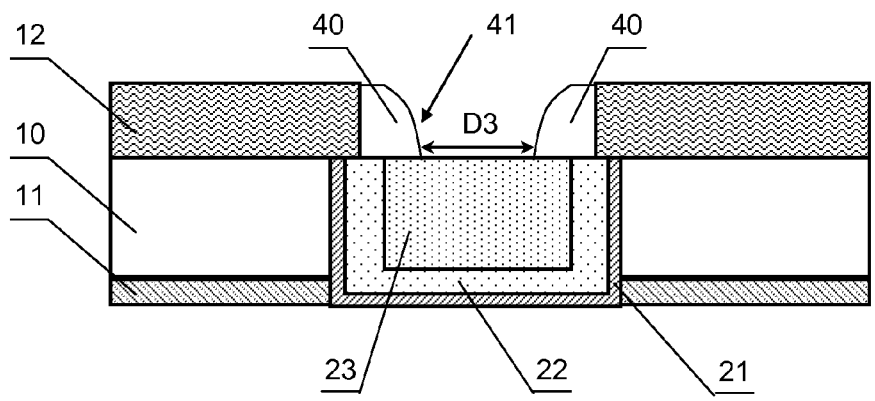

Further, as shown in FIG. 4, the edge wall 40 is formed at the edge of the opening 121 of the cap layer 12. Specifically, the edge wall 40 is formed by firstly depositing a layer of dielectric film to cover the opening 121 and then performing etching. The specific ways of forming the edge wall are well known to those skilled in the art and will not be discussed in detail. The thickness of deposited dielectric film layer determines the width size of the edge wall 40, and therefore determines the size D3 of the opening 41 in the edge wall 40. The size of original opening 121 is reduced due to the existence of the edge wall so that the area exposed by the copper lead is even reduced and becomes concentrated to an area that is closer to the middle portion. In this embodiment, the opening 41 having the size D3 partially exposes the middle area copper layer 23 of the copper lead to get ready for subsequent oxidization. The size D3 of the opening 41 can be determined by such factors as the size of the middle area copper layer 23 and the area of the storage medium layer, etc. For example, D3 is 10-100 nm smaller than D1. The specific materials of the edge wall 40 can be dielectric layers such as $SiO_2$, $Si_3N_4$, etc.

Figure 5:
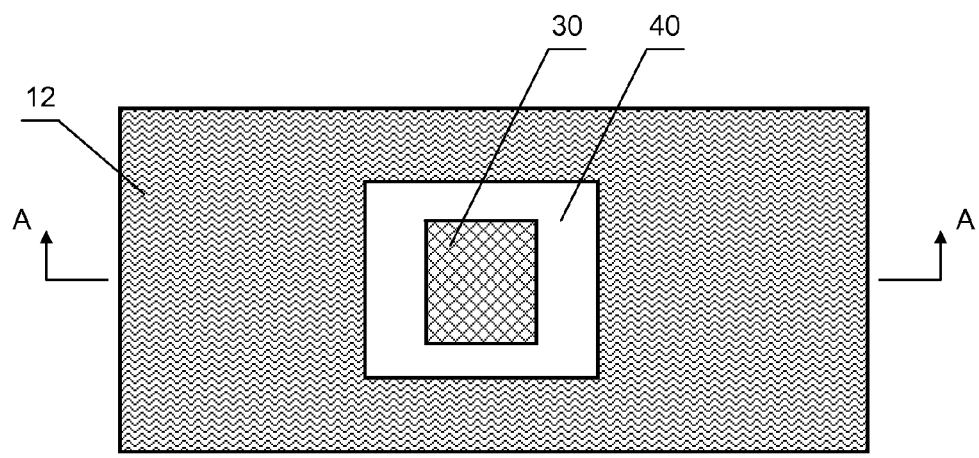
Figure 5:
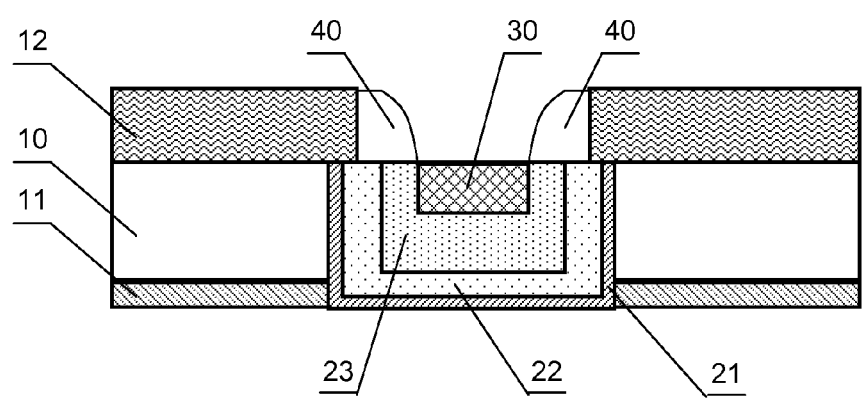

Furthermore, as shown in FIG. 5, the $Cu_xO$ storage medium layer 30 is formed by performing self-aligning oxidization with the cap layer 12 and the edge wall 40 as mask. The size of the $Cu_xO$ storage medium layer 30 is determined by the size D3 of the opening 41. Specifically, the oxidization can be plasma oxidization, heating oxidization, or chemical wet oxidization; alternatively, the oxidization can also be performed by mixing the plasma oxidization with heating oxidization. The specific oxidization methods and oxidization conditions are well known to those skilled in the art and are not discussed in detail herein. Since the middle area copper 30 has a relatively uniform physical structure and consistent performance, the $Cu_xO$ storage medium layer 30 formed thereon by self-alignment is also consistent in performance. Moreover, for a plurality of resistive memories formed simultaneously, the performances are also more consistent among the memories.

Further, as shown in FIG. 6, the upper electrode 50 is formed by depositing a metal layer. In this embodiment, the metal layer is firstly formed in the opening 41 by performing CVD depositing, and then the upper electrode 50 is formed by performing CMP (Chemical Mechanical Polishing).

The resistive memory of the embodiment shown in FIG. 6 is formed hereto. The manufacture procedure of subsequent copper interconnect process is well known to those skilled in the art and are not discussed in detail herein.

Figure 7:
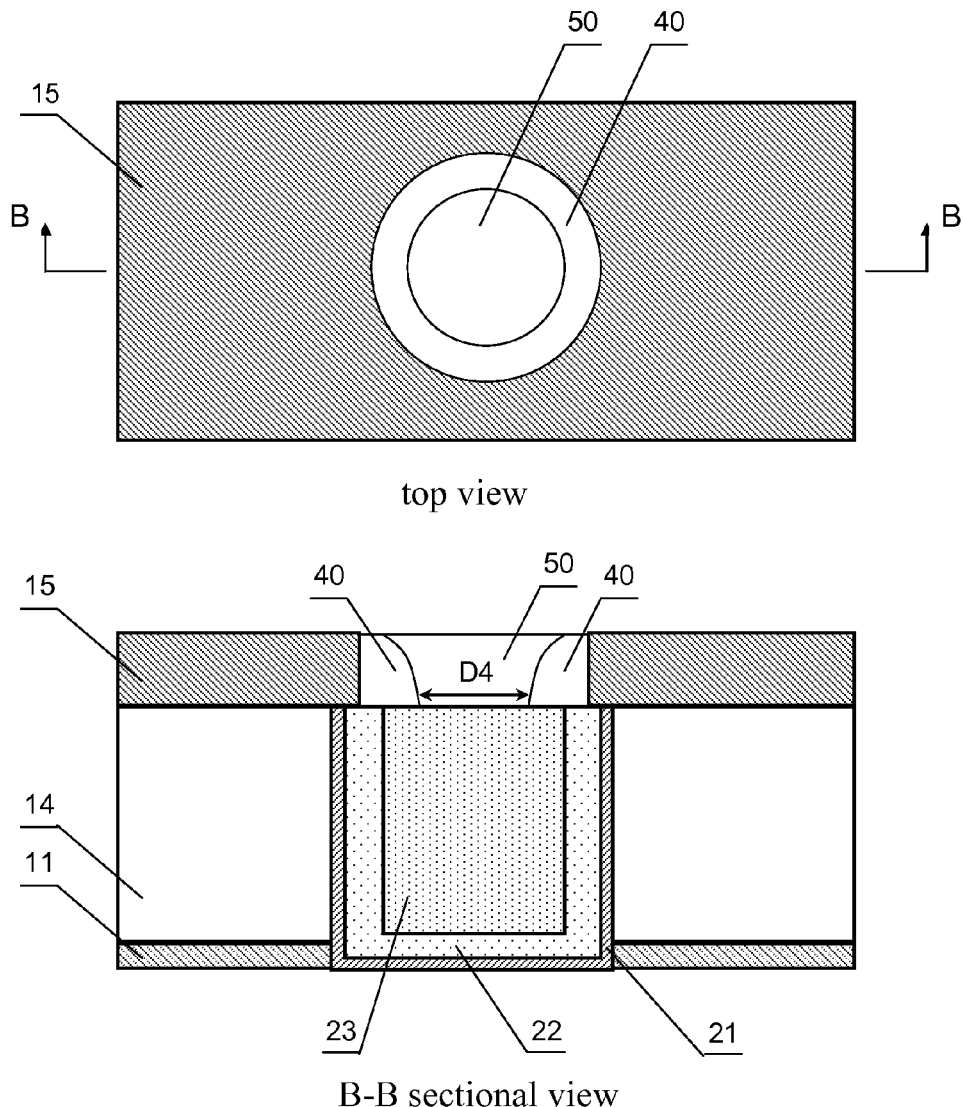
FIG. 7 is a schematic structural view of a resistive memory in accordance with another embodiment of the invention.

FIG. 7 is a schematic structural view of a resistive memory in accordance with another embodiment of the invention. In this embodiment, the resistive memory is integrated in a copper interconnect structure, but it is not formed on the copper lead of the embodiment shown in FIG. 6; rather, the resistive memory is formed on the copper plug of the copper interconnect structure. As compared to the resistive memory shown in FIG. 6, the main differences lie in that the copper plug comprising the diffusion barrier layer 21, the copper seed crystal layer 22 and the middle area copper layer 23 is formed in an inter-layer dielectric layer (IMD) 14, and that a first etch-terminating layer 15 is located above the inter-layer dielectric layer (IMD) 14, and a second etch-terminating layer 11 is located under the inter-layer dielectric layer (IMD) 14. In this embodiment, an circular opening is formed in the first etch-terminating layer 15 so as to expose the copper plug; similarly, an edge wall 40 is then formed so as to reduce the area of the circular opening (the diameter of the circular opening is reduced to D4) so that only the middle area copper layer 23 is partially or totally exposed and self-alignment oxidized.

Although the above embodiment is particularly described with reference to only a $Cu_xO$ resistive memory, the above $Cu_xO$ resistive memory having an edge wall structure can also be similarly applied to other resistive memories for improvement of consistency, such as tungsten oxide resistive memory and titanium oxide resistive memory, etc.

When a memory array (i.e., an array of memories) is formed by arranging the resistive memories of the above several embodiments in rows and columns, each resistive memory in the array can be formed by performing self-aligning oxidation on the middle area of the lower electrode. Therefore, the memory array is good in consistency. The memory of the invention can be formed by further combining the memory array with a peripheral circuit for the resistive memories. The peripheral circuit is well known to those skilled in the art and will not be discussed in detail.

The above examples mainly discuss resistive memory of the invention and method of fabricating the same. While only some of the embodiments of the invention have been described, it is understood by those skilled in the art that the invention can be implemented in many other forms without departing from the spirit and scope thereof. Therefore, the illustrated examples and embodiments should be construed as exemplary rather than limiting. The invention may cover various modifications and replacements without departing from the spirit and scope of the invention as defined by appended claims.

The invention claimed is:

1. A resistive memory, characterized by comprising:
 a lower electrode which is formed in a first dielectric layer by patterning;
 a second dielectric layer formed on the lower electrode and the first dielectric layer and provided with an opening for pattern-exposing the lower electrode;
 an edge wall formed in the opening of the second dielectric layer for covering a border area of the lower electrode and the first dielectric layer so that only the middle area of the lower electrode is partially or totally exposed;

a storage dielectric layer formed by performing oxidization with the second dielectric layer and the edge wall as mask; and an upper electrode.

2. The resistive memory according to claim 1, characterized in that the resistive memory is integrated in a copper interconnect structure, and the storage medium layer is a $Cu_xO$ storage medium layer, wherein $1<x\leq2$.

3. The resistive memory according to claim 2, characterized in that the lower electrode is copper lead, or the lower electrode is copper plug.

4. The resistive memory according to claim 3, characterized in that the border area of the lower electrode and the first dielectric layer comprises a diffusion barrier layer and a copper seed crystal layer.

5. The resistive memory according to claim 3, characterized in that the middle area of the lower electrode is a copper lead area formed by electroplating.

6. The resistive memory according to claim 2, characterized in that the first dielectric layer is interconnected wires dielectric layer, and the second dielectric layer is cap layer.

7. The resistive memory according to claim 3, characterized in that the first dielectric layer is inter-layer dielectric layer, and the second dielectric layer is etch-terminating layer.

8. The resistive memory according to claim 2, characterized in that the copper interconnect structure is a copper interconnect structure with a process node below 65 nm.

9. A method for fabricating the resistive memory according to claim 1, characterized by comprising the following steps:

providing a lower electrode which is formed in a first dielectric layer by patterning;

forming a second dielectric layer which covers the lower electrode and the first dielectric layer;

forming an opening in the second dielectric layer which exposes the lower electrode;

forming an edge wall in the opening for covering a border area of the lower electrode and the first dielectric layer so that only the middle area of the lower electrode is partially or totally exposed;

forming a storage medium layer by performing oxidization with the second dielectric layer and the edge wall as mask; and depositing an upper electrode.

10. The method according to claim 9, characterized in that the edge wall is formed by firstly depositing a layer of dielectric film which covers the opening and then performing etch.

11. The method according to claim 9, characterized in that the oxidization is plasma oxidization, heating oxidization or wet oxidization.

12. A memory comprising an array of memories, characterized in that the array of memories comprises a plurality of the resistive memories according to claim 1 arranged in rows and columns.

\* \* \* \* \*